(12) United States Patent
Li

(10) Patent No.: US 9,653,526 B2
(45) Date of Patent: May 16, 2017

(54) PIXEL DEFINING LAYER AND MANUFACTURING METHOD THEREOF, DISPLAY PANEL AND DISPLAY DEVICE

(71) Applicant: BOE TECHNOLOGY GROUP CO., LTD., Beijing (CN)

(72) Inventor: Xuyuan Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/912,267

(22) PCT Filed: Oct. 20, 2015

(86) PCT No.: PCT/CN2015/092262
§ 371 (c)(1),
(2) Date: Feb. 16, 2016

(87) PCT Pub. No.: WO2016/086728
PCT Pub. Date: Jun. 9, 2016

(65) Prior Publication Data
US 2016/0351635 A1 Dec. 1, 2016

(30) Foreign Application Priority Data

Dec. 4, 2014 (CN) .......................... 2014 1 0736128

(51) Int. Cl.
*H01L 51/56* (2006.01)
*H01L 27/32* (2006.01)
*H01L 51/52* (2006.01)

(52) U.S. Cl.
CPC .......... *H01L 27/3246* (2013.01); *H01L 27/32* (2013.01); *H01L 51/52* (2013.01); *H01L 51/56* (2013.01)

(58) Field of Classification Search
CPC ............. H01L 27/3202; H01L 27/3204; H01L 27/3246; H01L 51/50; H01L 51/5012
See application file for complete search history.

(56) References Cited

U.S. PATENT DOCUMENTS 7,294,856 B2 * 11/2007 Ito ....................... H01L 27/3246
257/13
7,795,809 B2 * 9/2010 Ito ....................... H01L 27/3246
257/79

(Continued)

FOREIGN PATENT DOCUMENTS

| CN | 101399283 A | 4/2009 |
| CN | 101926006 A | 12/2010 |

(Continued)

OTHER PUBLICATIONS

Notification of the First Office Action dated Apr. 12, 2016 corresponding to Chinese application No. 201410736128.4.

(Continued)

*Primary Examiner* — Nicholas Tobergte
(74) *Attorney, Agent, or Firm* — Nath, Goldberg & Meyer; Joshua B. Goldberg

(57) ABSTRACT

The present invention discloses a pixel defining layer and a manufacturing method thereof, a display panel and a display device. The pixel defining layer comprises a first pixel defining layer and a second pixel defining layer stacked on the first pixel defining layer, wherein the first pixel defining layer has a plurality of first openings corresponding to light-emitting regions of respective sub-pixels in one-to-one correspondence, the second pixel defining layer has a plurality of second openings corresponding to the first openings in one-to-one correspondence, a cross section of the first opening is in a regular trapezoidal shape which is narrow at top and wide at bottom, and a cross section of the second opening is in an inverted trapezoidal shape which is wide at (Continued)

top and narrow at bottom. The present invention can effectively avoid the short between the anode and the cathode and the open of the cathode.

12 Claims, 3 Drawing Sheets

(56) References Cited

U.S. PATENT DOCUMENTS

| | | | | |
|---|---|---|---|---|
| 8,299,478 B2* | 10/2012 | Chun | ............... | H01L 27/3246 257/40 |
| 2005/0112341 A1* | 5/2005 | Ito | ............... | H01L 27/3246 428/209 |
| 2008/0030119 A1* | 2/2008 | Ito | ............... | H01L 27/3246 313/483 |
| 2010/0193791 A1* | 8/2010 | Chun | ............... | H01L 27/3246 257/59 |
| 2014/0332763 A1* | 11/2014 | Kim | ............... | H01L 51/5268 257/40 |
| 2015/0179708 A1* | 6/2015 | Jeon | ............... | H01L 27/326 257/40 |

FOREIGN PATENT DOCUMENTS

| | | |
|---|---|---|
| CN | 102945855 A | 2/2013 |
| CN | 103413819 A | 11/2013 |
| CN | 103928497 A | 7/2014 |
| CN | 104393192 A | 3/2015 |
| JP | 2003007460 A | 1/2003 |
| JP | 2003223989 A | 8/2003 |

OTHER PUBLICATIONS

International Search Report dated Dec. 21, 2015 corresponding to International application No. PCT/CN2015/092262.
Written Opinion of the International Searching Authority dated Dec. 21, 2015 corresponding to International application No. PCT/CN2015/092262.

* cited by examiner

PIXEL DEFINING LAYER AND MANUFACTURING METHOD THEREOF, DISPLAY PANEL AND DISPLAY DEVICE

This is a National Phase Application filed under 35 U.S.C. 371 as a national stage of PCT/CN2015/092262, filed Oct. 20, 2015, an application claiming the benefit of Chinese Application No. 201410736128.4, filed Dec. 4, 2014, the content of each of which is hereby incorporated by reference in its entirety.

TECHNICAL FIELD

The present invention relates to the field of display technology, and particularly to a pixel defining layer and a manufacturing method thereof, a display panel and a display device.

BACKGROUND

Method for manufacturing OLED/PLED displays by using solution processes has many advantages and potentials such as low cost, high yield and capability to easily reach large size, and is a potential development direction of the OLED technology.

In the OLED/PLED technology, it is required to use an organic or inorganic material to manufacture a pixel defining layer, to define an organic material for emitting light within sub-pixel regions defined in the pixel defining layer, so as to achieve high resolution and full color display.

In the prior art, as shown in FIG. 1(a), when an organic light emitting device is manufactured by using inkjet printing or nozzle printing, an anode 102 is usually formed of an hydrophilic transparent conductive film (such as ITO film), and for a good attachment with the anode 102, the solvent for forming an organic light emitting material layer 104 (including a hole transport layer and a hole injection layer) is also hydrophilic. However, the pixel defining layer 103 is usually formed of positive photoresist. Since the pixel defining layer 103 is formed of positive photoresist, after being exposed and developed, the pixel defining layer 103 may have an inverted trapezoidal shape (which is wide at top and narrow at bottom which has a proper slope angle and thus may reduce breakage of the organic material film layer or the cathode film layer. However, the positive photoresist has hydrophobicity, resulting in poor attachment between the hydrophilic organic material solvent and the hydrophobic pixel defining layer, the formed organic light emitting material layer 104 may contract and thus the cathode 105 and the anode 102 may have a short circuit therebetween, causing adverse display of the display device, and it should be noted that, in the figure, 101 represents the substrate.

In the case that the pixel defining layer is formed of negative photoresist, both the pixel defining layer and the organic material solvent are hydrophilic, avoiding the contraction of the organic material, and thus restraining short between the cathode and the anode. However, the pixel defining layer formed of negative photoresist has a regular trapezoidal shape (which is narrow at top and wide at bottom), as shown in FIG. 1(b), the slope angle of the regular trapezoid is improper, so that the cathode is intended to be open, thus resulting in adverse display of the display device.

SUMMARY OF THE INVENTION

In view of above, the present invention proposes a pixel defining layer and a manufacturing method thereof, a display panel and a display device, which can prevent the short-circuiting between the cathode and the anode and the phenomenon that the cathode is in an open state from easily occurring in the organic light emitting device manufactured by using an inkjet printing method or a nozzle print method.

According to a first aspect, the present invention provides a pixel defining layer comprising a first pixel defining layer and a second pixel defining layer stacked on the first pixel defining layer, wherein the first pixel defining layer has a plurality of first openings corresponding to light-emitting regions of respective sub-pixels in one-to-one correspondence, the second pixel defining layer has a plurality of second openings corresponding to the plurality of first openings in one-to-one correspondence, cross section of the first opening being in a regular trapezoidal shape which is narrow at top and wide at bottom, and a cross section of the second opening is in an inverted trapezoidal shape which is wide at top and narrow at bottom.

Preferably, the first pixel defining layer is a hydrophilic film layer, and the second pixel defining layer is a hydrophobic film layer.

Preferably, the hydrophilic film layer is a negative photoresist film layer, and the hydrophobic film layer is a positive photoresist film layer.

Preferably, a thickness of the first pixel defining layer is smaller than that of the second pixel defining layer.

Preferably, the thickness of the first pixel defining layer is between 2000 Å~5000 Å, and the thickness of the second pixel defining layer is between 5000 Å~15000 Å.

According to a second aspect, the present invention provides a display panel comprising the above pixel defining layer formed on a substrate.

Preferably, the plurality of first openings of the first pixel defining layer are formed therein with anode layers and organic light-emitting layers of respective sub-pixels, the organic light-emitting layer is on the anode layer, and a sum of thicknesses of the organic light-emitting layer and the anode layer is identical to or larger than the thickness of the first pixel defining layer.

Preferably, the plurality of second openings of the second pixel defining layer are formed therein with cathode layers of respective layer.

According to a third aspect, the present invention provides a display device comprising the above display panel.

According to a fourth aspect, the present invention provides a manufacturing method of a pixel defining layer comprising:

forming a hydrophilic film layer on a substrate, and patterning the hydrophilic film layer to form a first pixel defining layer having a plurality of first openings corresponding to light-emitting regions of sub-pixels in one-to-one correspondence; and forming a hydrophobic film layer on the substrate formed with the first pixel defining layer thereon, and patterning the hydrophobic film layer to form a second pixel defining layer having a plurality of second openings corresponding to the plurality of first openings in one-to-one correspondence.

Preferably, the step of forming a hydrophilic film layer on a substrate, and patterning the hydrophilic film layer to form a first pixel defining layer having a plurality of first openings corresponding to light-emitting regions of respective sub-pixels in one-to-one correspondence comprises:

forming a negative photoresist film with a first predetermined thickness on the substrate by using a spin coating method or a drop coating method; and exposing and developing the negative photoresist film to form the plurality of first openings corresponding to light-emitting regions of respective sub-pixels in one-to-one correspondence.

Preferably, the step of forming a hydrophobic film layer on the substrate formed with the first pixel defining layer thereon, and patterning the hydrophobic film layer to form a second pixel defining layer having a plurality of second openings corresponding to the plurality of first openings in one-to-one correspondence comprises:

forming a positive photoresist film with a second predetermined thickness on the substrate formed with the first pixel defining layer thereon by using a spin coating method or a drop coating method; and exposing and developing the positive photoresist film to form the plurality of second openings corresponding to the plurality of first openings in one-to-one correspondence.

In the present invention, in view of the phenomenon of short-circuiting between the cathode and the anode or the phenomenon that the cathode is in an open state due to contraction of the organic material when the pixel defining layer of the organic light emitting device is manufactured, two pixel defining layers, i.e., the first pixel defining layer and the second pixel defining layer, are adopted to constitute one pixel defining layer for defining light emitting regions of respective sub-pixel units, and the first pixel defining layer is a hydrophilic film layer, and the second pixel defining layer is a hydrophobic film layer. After organic light emitting material solution is printed in the light emitting regions defined by the first pixel defining layer and the second pixel defining layer, the organic light emitting material may be well attached to the first pixel defining layer due to the hydrophilicity thereof, and may completely cover the anode layer in the light emitting region, thus even after the cathode is formed sequentially, short-circuiting between the anode and the cathode due to contraction of the organic light emitting layer may be avoided. Moreover, when the first pixel defining layer is formed of negative photoresist, cross section of each of the plurality of first openings formed therein is usually in a regular trapezoidal shape which is narrow at top and wide at bottom, in order to prevent the phenomenon that the cathode is in an open state when the cathode is formed, in the present invention, the hydrophobic second pixel defining layer is formed on the first pixel defining layer, the second pixel defining layer has a plurality of second openings corresponding to the plurality of first openings in one-to-one correspondence, and cross section of the second opening is in an inverted trapezoidal shape which is wide at top and narrow at bottom. Therefore, the phenomenon that the cathode is in an open state when forming the cathode above the organic light emitting layer may be avoided.

DETAILED DESCRIPTION OF EMBODIMENTS

To make the object, solutions and advantages of the present invention more clear and apparent, the invention will be described in detail below in conjunction to specific embodiments and with reference to the drawings.

Figure 1:
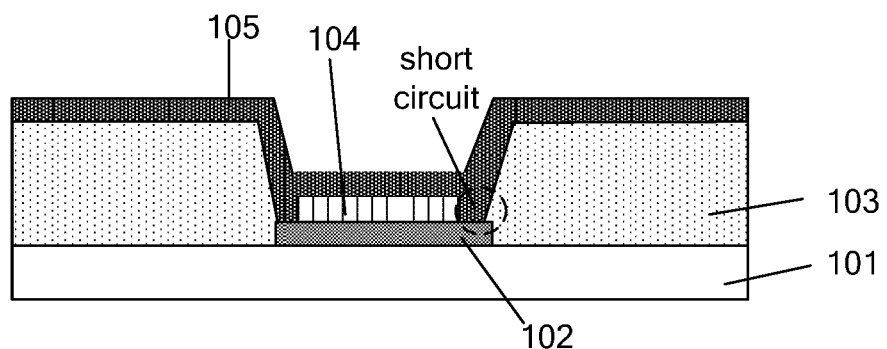
FIG. 1(a) and FIG. 1(b) are structural diagrams of organic light emitting devices in the prior art.
Figure 1:
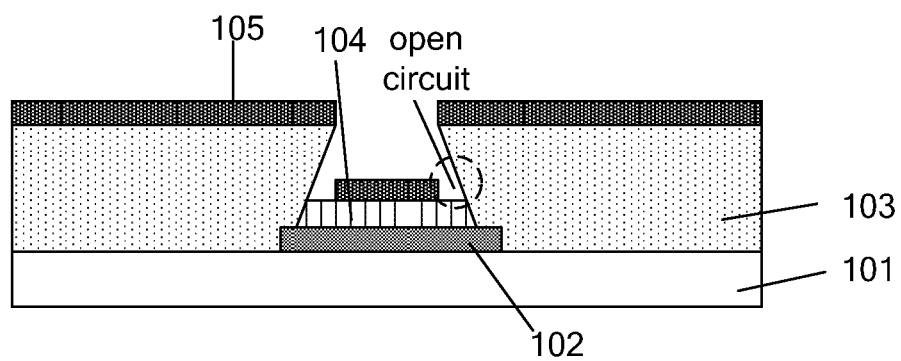
Figure 2:
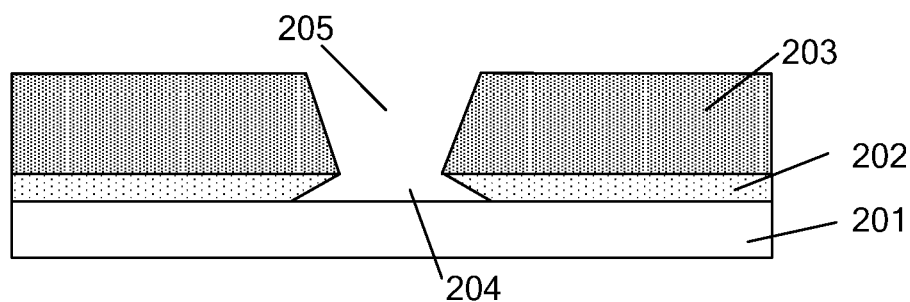
FIG. 2(a) is a structural diagram of a pixel defining layer according to an embodiment in the present invention.
FIG. 2(b) is a structural diagram of a display panel including the pixel defining layer according to an embodiment in the present invention.
Figure 2:
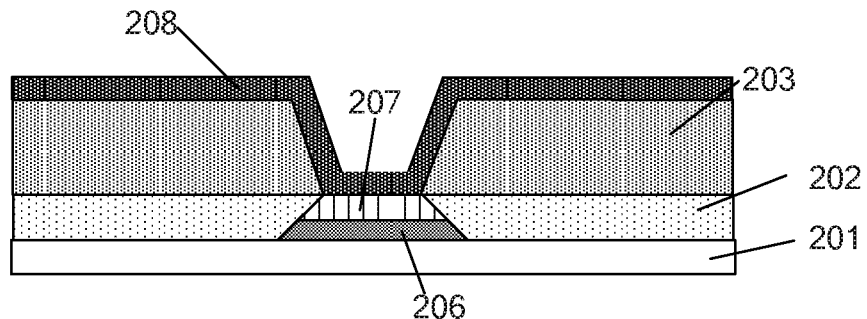

FIG. 2(a) and FIG. 2(b) show structural diagrams of a pixel defining layer according to an embodiment in the present invention. As shown in FIG. 2(a) and FIG. 2(b), the pixel defining layer comprises a first pixel defining layer 202 and a second pixel defining layer 203 stacked on the first pixel defining layer 202, wherein the first pixel layer 202 has a plurality of first openings 204 corresponding to light-emitting regions of respective sub-pixels in one-to-one correspondence, the second pixel defining layer 204 has a plurality of second openings 205 corresponding to the plurality of first openings 204 in one-to-one correspondence, cross section of the first opening 204 is in a regular trapezoidal shape which is narrow at top and wide at bottom, and cross section of the second opening 205 is in an inverted trapezoidal shape which is wide at top and narrow at bottom, and as an example, only one first opening 204 and one second opening 205 are illustrated in FIG. 2(a) and FIG. 2(b).

Optionally, the first pixel defining layer 202 is a hydrophilic film layer, and the second pixel defining layer 203 is a hydrophobic film layer.

Optionally, the hydrophilic film layer is formed of negative photoresist, and the hydrophobic film layer is formed of positive photoresist.

In an OLED/PLED display panel, the plurality of openings formed in the pixel defining layer are used to define the light emitting regions of the respective sub-pixel units, organic light emitting material solution may be formed in the light emitting regions through printing, and therefore, the pixel defining layer can well prevent the color mixture of organic light emitting materials in respective sub-pixel units of different colors.

Generally, the pixel defining layer may be formed of photoresist, in the present invention, in view of the phenomenon of short between the cathode and the anode or the phenomenon of open of the cathode due to contraction of the organic light emitting material when the pixel defining layer is manufactured by using the photoresist, two pixel defining layers, i.e., the first pixel defining layer 202 and the second pixel defining layer 203, are adopted to constitute one pixel defining layer for defining light emitting regions of the respective sub-pixel units, and the first pixel defining layer 202 is a hydrophilic film layer, and the second pixel defining layer 203 is a hydrophobic film layer. After organic light emitting material solution is printed in the light emitting regions defined by the first pixel defining layer 202 and the second pixel defining layer 203, the organic light emitting material may be well attached to the first pixel defining layer 202 due to the hydrophilicity thereof, and may fill the whole bottoms of the light emitting regions, thus even after the cathode is formed sequentially, short between the anode and the cathode due to contraction of the organic light emitting layer may be avoided. Moreover, since the first pixel defining layer 202 is formed of negative photoresist, cross section of each of the plurality of first openings formed therein is usually in a regular trapezoidal shape which is narrow at top and wide at bottom, in order to prevent open of the cathode when the cathode is formed, in the present invention, the hydrophobic second pixel defining layer 203 is formed on the first pixel defining layer 202, the second pixel defining layer 203 has a plurality of second openings 205 corresponding to the plurality of first openings 204 in one-to-one correspondence, and cross section of the second opening 205 is in an inverted trapezoidal shape which is wide at top and narrow at bottom. Therefore, the open of the cathode when forming the cathode above the organic light emitting layer may be avoided.

Optionally, the first pixel defining layer 202 is formed on a substrate 201.

Optionally, a thickness of the first pixel defining layer 202 is smaller than that of the second pixel defining layer 203. The plurality of first openings 204 formed in the first pixel defining layer 202 are mainly used to form anodes and fill the organic light emitting material above the anodes, if the thickness of the first pixel defining layer 202 is too large so as to be larger than a sum of thicknesses of the anode and the organic light emitting layer, when the cathode is formed, as the cathode may be formed in the first opening 204 which is narrow at top and wide at bottom so that the cathode may be open. Therefore, the thickness of the first pixel defining layer 202 is preferably smaller than or equal to the sum of thicknesses of the anode and the organic light emitting layer, thus the cathode layer is only formed in the second opening 205 which is wide at top and narrow at bottom, so that the cathode is prevented from being in an open state.

Optionally, the thickness of the first pixel defining layer 202 is between 2000 Å~5000 Å, and the thickness may be thinned by a Plasma Ashing process after the plurality of first openings 204 are formed through exposure and development.

Optionally, the plurality of first openings 204 may be formed by an exposure process and a development process. Since the first pixel defining layer 202 is formed of the hydrophilic negative photoresist film, after exposing, the cross section of the formed first opening 204 is in a regular trapezoidal shape which is narrow at top and wide at bottom. Certainly, when the first pixel defining layer 202 may be formed by using other hydrophilic materials, under some growth circumstances and parameters, the cross section of the formed first opening 204 may also be in a regular trapezoidal shape which is narrow at top and wide at bottom.

Optionally, the thickness of the second pixel defining layer 203 is between 5000 Å~15000 Å.

Optionally, the plurality of second openings 205 may be formed by an exposure process and a development process. Since the second pixel defining layer 203 is formed of the hydrophobic positive photoresist film, after exposing, the cross section of the formed second opening 205 is in an inverted trapezoidal shape which is wide at top and narrow at bottom.

During manufacturing a display panel, after the first pixel defining layer 202 and the second pixel defining layer 203 are formed, anode layers of sub-pixel units may be formed in the first openings 204, then organic light emitting material solution is printed on the anode layers so as to form the organic light emitting layers. Since the organic light emitting material solution is hydrophilic, it can be well attached to the hydrophilic first pixel defining layer 202, and thus can fill the whole inner space of the first opening 204 above the anode layer, avoiding the short between the cathode and the anode due to the contraction of the organic light emitting material solution.

After the organic light emitting layer is manufactured, metal is evaporated thereon so as to form the cathode layer, since the sum of the thicknesses of the anode layer and the cathode layer is larger than or equals to that of the first pixel defining layer 202, the cathode layer is only formed in the second opening 205. Moreover, since the second opening 205 formed in the second pixel defining layer 203 is in an inverted trapezoidal shape which is wide at top and narrow at bottom, effectively avoiding the open of the cathode when the metal for the cathode is evaporated.

With the above solution proposed in the present invention, the short between the cathode and the anode and the open of the cathode occurring when the organic light emitting device is manufactured by using an inkjet printing method or a nozzle print method, can be effectively avoided.

The present invention also proposes a display panel comprising an anode layer, a cathode layer and the above pixel defining layer formed on a substrate.

Each of the plurality of first openings 204 in the first pixel defining layer 202 are formed therein with an anode layer and an organic light emitting layer for a sub-pixel unit, a sum of the thicknesses of the anode layer and the organic light emitting layer is larger than or equals to that of the first pixel defining layer 202. As shown in FIG. 2(b), 206 represents the anode layer, 207 represents the light emitting layer and 208 represents the cathode layer. It can be seen from the figure that, in the solution proposed in the present invention, both the short between the anode and the cathode and the open of the cathode are non-existent.

Figure 3:
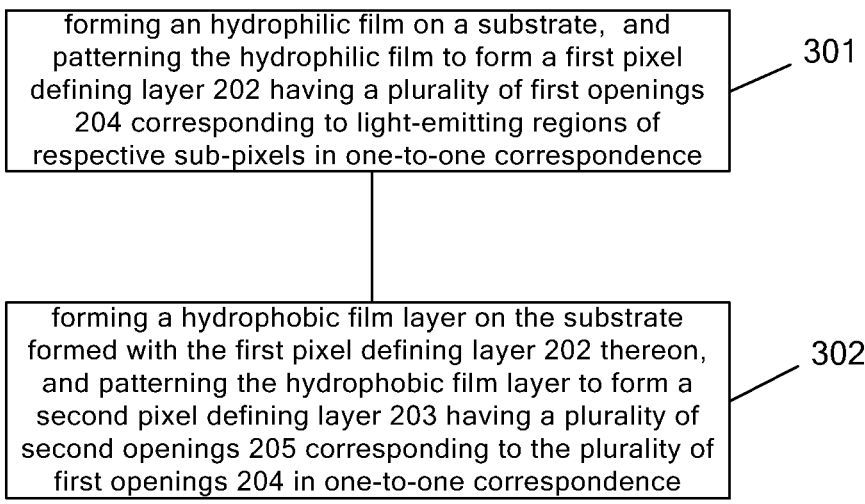
FIG. 3 is a flow chart of a manufacturing method of the pixel defining layer according to an embodiment of the present invention.
Figure 4:
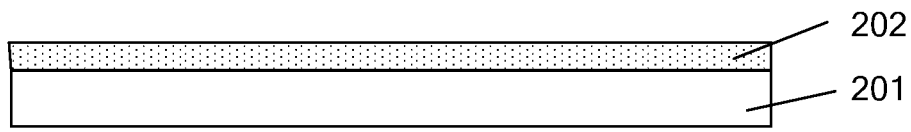
FIG. 4(a)~FIG. 4(b) are flow charts of manufacturing processes of the pixel defining layer according to an embodiment of the present invention.
Figure 4:
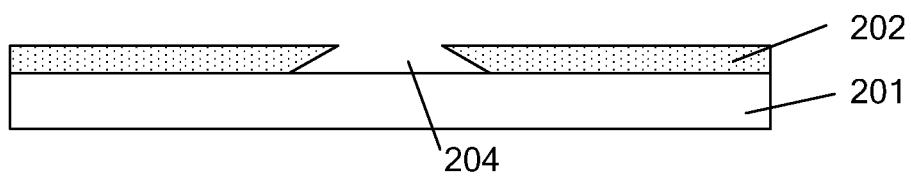
Figure 4:
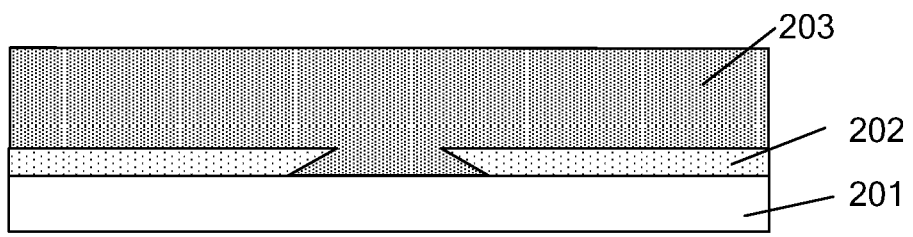
Figure 4:
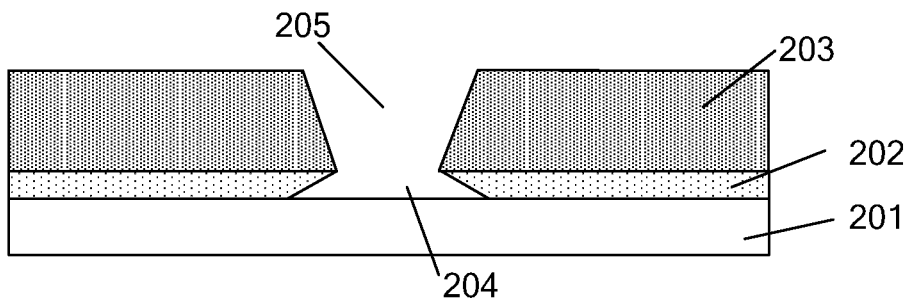

FIG. 3 is a flow chart of a manufacturing method of the pixel defining layer according to an embodiment of the present invention. FIG. 4(a)~FIG. 4(b) are flow charts of manufacturing processes of the pixel defining layer according to an embodiment of the present invention. As shown in FIG. 3 and FIG. 4, the manufacturing method comprises:

step 301, forming an hydrophilic film on a substrate, as shown in FIG. 4(a), and patterning the hydrophilic film to form a first pixel defining layer 202 having a plurality of first openings 204 corresponding to light-emitting regions of respective sub-pixels in one-to-one correspondence, as shown in FIG. 4(b).

Optionally, the substrate may be a glass substrate or an array substrate.

Optionally, the step 301 may further comprise:

Spin coating or drop coating a negative photoresist film with a first predetermined thickness on the substrate, wherein the first predetermined thickness may be determined as desired, and preferably is between 2000 Å~5000 Å. Alternatively, the negative photoresist film may be thinned to the thickness between 2000 Å~5000 Å by a Plasma Ashing process after it is patterned so that the plurality of first openings 204 are formed.

After the negative photoresist film is spin coated or drop coated, the negative photoresist film is exposed and developed so as to form the plurality of first openings 204 corresponding to light-emitting regions of respective sub-pixels in one-to-one correspondence.

Since the first pixel defining layer 202 is formed by a negative photoresist film, a cross section of each of the plurality of first openings 204 formed by exposing and developing the first pixel defining layer 202 is in a regular trapezoidal shape which is narrow at top and wide at bottom.

step 302, forming a hydrophobic film layer on the substrate formed with the first pixel defining layer 202 thereon, as shown in FIG. 4(c), and patterning the hydrophobic film layer to form a second pixel defining layer 203 having a plurality of second openings 205 corresponding to the plurality of first openings 204 in one-to-one correspondence, as shown in FIG. 4(d).

Optionally, the step 302 may further comprise:

forming a positive photoresist film with a second predetermined thickness on the substrate formed with the first pixel defining layer 202 thereon by using a spin coating method or a drop coating method; and exposing and developing the positive photoresist film to form the plurality of second openings 205 corresponding to the plurality of first openings 204 in one-to-one correspondence.

Since the second pixel defining layer 203 is formed of the hydrophobic positive photoresist film, after exposing, the cross section of the formed second opening 205 is in an inverted trapezoidal shape which is wide at top and narrow at bottom.

In another embodiment of the present invention, to save the processes, it is also possible to sequentially form a hydrophilic film layer and a hydrophobic film layer on a substrate, then the hydrophilic film layer and the hydrophobic film layer are patterned together, so that a plurality of first openings 204 are formed in the hydrophilic film layer and a plurality of second openings 205 are formed in the hydrophobic film layer.

With the pixel defining layer manufactured by the above manufacturing method proposed in the present invention, since both the hydrophilic first pixel defining layer 202 and the hydrophobic the second pixel defining layer 203 are used to constitute the pixel defining layer, and the first pixel defining layer 202 has a plurality of first openings 204 therein corresponding to light-emitting regions of respective sub-pixels in one-to-one correspondence, the second pixel defining layer 203 has a plurality of second openings 205 therein corresponding to the plurality of first openings 204 in one-to-one correspondence. Due to the hydrophilicity of the first pixel defining layer 202, the hydrophilic organic light emitting material solution may easily spread in the plurality of first openings 204 in the first pixel defining layer 202 so as to fill the first openings 204, avoiding the short between the anode and the cathode. Moreover, since the second pixel defining layer 203 is formed by a hydrophobic film layer, the cross section of the second opening 205 formed therein is in an inverted trapezoidal shape which is wide at top and narrow at bottom, avoiding the open of the cathode.

The object, solutions and advantages of the present invention are described in detail with respect to the above embodiments, it should be understood that, the above embodiments are only exemplary embodiments employed to illustrate the principle of the invention, and the invention is not limited thereto. For ordinary persons skilled in the art, various variants and improvements can be made without departing from the spirit and substance of the invention, and these variants and improvements are also regarded as the protection scope of the invention.

The invention claimed is:

1. A pixel defining layer comprising a first pixel defining layer and a second pixel defining layer stacked on the first pixel defining layer, wherein the first pixel defining layer has a plurality of first openings corresponding to light-emitting regions of respective sub-pixels in one-to-one correspondence, the second pixel defining layer has a plurality of second openings corresponding to the plurality of first openings in one-to-one correspondence, a cross section of the first opening is in a regular trapezoidal shape which is narrow at top and wide at bottom, and a cross section of the second opening is in an inverted trapezoidal shape which is wide at top and narrow at bottom;

wherein the first pixel defining layer is a hydrophilic film layer, and the second pixel defining layer is a hydrophobic film layer; and wherein the hydrophilic film layer is a negative photoresist film layer, and the hydrophobic film layer is a positive photoresist film layer.

2. The pixel defining layer of claim 1, wherein a thickness of the first pixel defining layer is smaller than that of the second pixel defining layer.

3. The pixel defining layer of claim 2, wherein the thickness of the first pixel defining layer is between 2000 Å~5000 Å, and the thickness of the second pixel defining layer is between 5000 Å~15000 Å.

4. A display panel comprising the pixel defining layer of claim 1 formed on a substrate.

5. The display panel of claim 4, wherein the plurality of first openings of the first pixel defining layer are formed therein with anode layers and organic light-emitting layers of respective sub-pixels, the organic light-emitting layer is on the anode layer, and a sum of thicknesses of the organic light-emitting layer and the anode layer is identical to or larger than the thickness of the first pixel defining layer.

6. The display panel of claim 5, wherein the plurality of second openings of the second pixel defining layer are formed therein with cathode layers of respective sub-pixels, and the cathode layer is on the organic light-emitting layer.

7. A display device comprising the display panel of claim 4.

8. A display device comprising the display panel of claim 5.

9. A display device comprising the display panel of claim 6.

10. A manufacturing method of a pixel defining layer comprising:

forming a hydrophilic film layer on a substrate, and patterning the hydrophilic film layer to form a first pixel defining layer having a plurality of first openings corresponding to light-emitting regions of respective sub-pixels in one-to-one correspondence; and forming a hydrophobic film layer on the substrate formed with the first pixel defining layer thereon, and patterning the hydrophobic film layer to form a second pixel defining layer having a plurality of second openings corresponding to the plurality of first openings in one-to-one correspondence;

wherein the hydrophilic film layer is a negative photoresist film layer, and the hydrophobic film layer is a positive photoresist film layer.

11. The manufacturing method of claim 10, wherein the step of forming a hydrophilic film layer on a substrate, and patterning the hydrophilic film layer to form a first pixel defining layer having a plurality of first openings corresponding to light-emitting regions of respective sub-pixels in one-to-one correspondence comprises:

forming the negative photoresist film with a first predetermined thickness on the substrate by using a spin coating method or a drop coating method; and exposing and developing the negative photoresist film to form the plurality of first openings corresponding to light-emitting regions of respective sub-pixels in one-to-one correspondence.

12. The manufacturing method of claim 10, wherein the step of forming a hydrophobic film layer on the substrate formed with the first pixel defining layer thereon, and patterning the hydrophobic film layer to form a second pixel defining layer having a plurality of second openings corresponding to the plurality of first openings in one-to-one correspondence comprises:
- forming the positive photoresist film with a second predetermined thickness on the substrate formed with the first pixel defining layer thereon by using a spin coating method or a drop coating method; and
- exposing and developing the positive photoresist film to form the plurality of second openings corresponding to the plurality of first openings in one-to-one correspondence.

* * * * *